(12) United States Patent
Irisawa et al.

(10) Patent No.: US 10,772,213 B2
(45) Date of Patent: Sep. 8, 2020

(54) ADHESIVE SUBSTRATE AND METHOD FOR SEPARATING AN OBJECT FROM AN ADHESIVE SUBSTRATE

(71) Applicant: Shin-Etsu Polymer Co., Ltd., Tokyo (JP)

(72) Inventors: Yuji Irisawa, Saitama (JP); Toshiaki Hatsumi, Saitama (JP)

(73) Assignee: Shin-Etsu Polymer Co., Ltd., Tokyo (JP)

(*) Notice: Subject to any disclaimer, the term of this patent is extended or adjusted under 35 U.S.C. 154(b) by 9 days.

(21) Appl. No.: 16/121,953

(22) Filed: Sep. 5, 2018

(65) Prior Publication Data

US 2019/0327838 A1  Oct. 24, 2019

(30) Foreign Application Priority Data

Apr. 18, 2018 (JP) .................... 2018-080075

(51) Int. Cl.
| | | |
|---|---|---|
| *H05K 3/30* | (2006.01) | |
| *H01L 23/00* | (2006.01) | |
| *B32B 7/12* | (2006.01) | |
| *C09J 163/00* | (2006.01) | |

(52) U.S. Cl.
CPC ............ *H05K 3/305* (2013.01); *H01L 24/28* (2013.01); *B32B 7/12* (2013.01); *C09J 163/00* (2013.01)

(58) Field of Classification Search
CPC ..................................................... H05K 3/305
See application file for complete search history.

(56) References Cited

U.S. PATENT DOCUMENTS 8,299,402 B2    10/2012  Yamanaka et al.
2011/0151625 A1*  6/2011  Hoshino ............... H01L 21/568
                                                          438/118

FOREIGN PATENT DOCUMENTS

JP    2010118776 A   5/2010
JP    2017171896 A   9/2017

* cited by examiner

*Primary Examiner* — Daniel H Lee
(74) *Attorney, Agent, or Firm* — The Webb Law Firm

(57) ABSTRACT

An adhesive substrate is disclosed, which includes a base substrate and a heat-resistant elastomer layer formed on the base substrate, wherein the base substrate is flexible and has a thickness of 0.2 mm or more and 2 mm or less, wherein the adhesive substrate is used as part of a method for physically separating an object that has been held immovable in such a manner that the object has been adhered to by the heat-resistant elastomer layer and the object is anchored from the upper side, and wherein by starting to physically separate the end portion of the adhesive substrate downward the object is able to be separated.

5 Claims, 6 Drawing Sheets

Fig.8

| Table 1 | | | Example 1 | Example 2 | Example 3 | Example 4 |
|---|---|---|---|---|---|---|
| Adhesive Substrate | Base Substrate | Material | SUS Stainless Steel | SUS Stainless Steel | SUS Stainless Steel | SUS Stainless Steel |
| | | Thickness | 0.5mm | 0.5mm | 0.25mm | 2mm |
| | Heat-Resistant Elastomer | Material | Fluorine Based | Silicone | Fluorine Based | Fluorine Based |
| | | Thickness | 20μm | 20μm | 20μm | 5μm |
| | | Hardness | 5 | 30 | 5 | 5 |
| Resin | | Ingredients | Epoxy Resin | Epoxy Resin | Epoxy Resin | Epoxy Resin |
| Separation Conditions | Holding Plate | Material | SUS Stainless Steel | SUS Stainless Steel | Not Used | SUS Stainless Steel |
| | | Thickness | 0.3mm | 0.3mm | Not Used | 0.3mm |
| | Separation Speed | Angle | 15° | 15° | 30° | 5° |
| | | Speed | 100mm/min | 100mm/min | 100mm/min | 50mm/min |
| Results | Releasability | | Good Separage | Good Separage | Good Separage | Good Separage |
| | Reusability of Adhesive Substrate | | Reusable | Reusable | Reusable | Reusable |
| | Determination | | Good | Good | Good | Good |

Fig.9

| Table 2 | | | Comparative Example 1 | Comparative Example 2 |
|---|---|---|---|---|
| Adhesive Substrate | Base Substrate | Material | SUS Stainless Steel | SUS Stainless Steel |
| | | Thickness | 0.1mm | 3mm |
| | Heat-Resistant Elastomer | Material | Fluorine Based | Silicone |
| | | Thickness | 20μm | 100μm |
| | | Hardness | 5 | 30 |
| Resin | | Ingredients | Epoxy Resin | Epoxy Resin |
| Separation Conditions | Holding Plate | Material | SUS Stainless Steel | Not Used |
| | | Thickness | 0.3mm | Not Used |
| | Separation Speed | Angle | 40° | 5° |
| | | Speed | 100mm/min | 50mm/min |
| Results | Releasability | | Separable | Not Separable |
| | Reusability of Adhesive Substrate | | Base Substrate Warpage | Not Reusable |
| | Determination | | Bad | Bad |

ADHESIVE SUBSTRATE AND METHOD FOR SEPARATING AN OBJECT FROM AN ADHESIVE SUBSTRATE

CROSS-REFERENCE TO RELATED APPLICATION

This application claims priority to Japanese Patent Application No. 2018-080075 filed Apr. 18, 2018, the disclosure of which is hereby incorporated in its entirety by reference.

BACKGROUND OF THE INVENTION

Field of the Invention

The disclosure is related to an adhesive substrate capable of being separated from an object after being adhered to the object, and a method of separating an object from an adhesive substrate.

Description of Related Art

Along with the desire for miniaturization and high performance of various electronic devices such as personal computers, digital cameras, mobile phones, and the like, the demands for the further miniaturization, thinning, and increased density of semiconductor devices is also rapidly increasing. Due to these circumstances, high-density mounting technology such as chip scale packages (CSP) have been developed. Of these, wafer-level CSPs (WLCSP), in which a part of the semiconductor is exposed without internally wiring using bonding wires, has attracted attention.

Since such WLCSPs have a small area, the number of terminals that can be externally connected is limited; however, in recent years, higher integration and more external connections are being required. In order to meet these demands, eWLBs (Embedded Wafer Level Ball Grid Arrays) are being developed. Conventionally, the manufacturing method for manufacturing such a package has been to use a technique of holding a semiconductor chip on a supporting base substrate with an adhesive film and sealing the semiconductor chip with a sealing resin such as an epoxy resin.

With regard to the adhesive film used for sealing the semiconductor chip with an epoxy resin or the like, Patent Document 1 discloses, for example, a double-sided adhesive tape or double-sided adhesive sheet in which an adhesive layer made from a thermal foaming agent is formed on at least one side of the substrate, and a heating element which heats the foaming agent-containing adhesive layer in order to foam the adhesive layer.

Also, Patent Document 2 discloses an adhesive tape for processing a semiconductor wafer having an adhesive layer on at least one side of a substrate film and that the adhesive tape for semiconductor wafer processing is able to be separated by ultraviolet irradiation.

[Patent Document 1] Japanese Laid-open Patent Publication No. 2010-118776
[Patent Document 2] Japanese Laid-open Patent Publication No. 2017-171896

However, in the adhesive sheets described in Patent Document 1 and Patent Document 2, since the adhesive force of the adhesive decreases due to heating or UV irradiation during separation, the adhesive sheets will likely be discarded after separation from the semiconductor chip sealed with resin and are most likely a single use type which makes it impossible to use the adhesive sheets repeatedly.

Accordingly, the present invention has been made in view of the aforementioned problems, and the object of the present invention is to provide an adhesive substrate which can easily change between a state of holding an object and a state of being separated from an object, as well as providing a method of separating an object from the adhesive substrate.

SUMMARY OF THE INVENTION

According to one aspect, an adhesive substrate is provided, which includes:
a base substrate and a heat-resistant elastomer layer formed on the base substrate, wherein the base substrate is flexible and has a thickness of 0.2 mm or more and 2 mm or less, and wherein the adhesive substrate is used as part of a method for physically separating an object that has been held immovable in such a manner that the object has been adhered to by the heat-resistant elastomer layer and the object is anchored from the upper side, and wherein the object is able to be separated by starting to physically separate the end portion of the adhesive substrate downward.

BRIEF DESCRIPTION OF THE DRAWINGS

FIG. 8 is a diagram showing Table 1.
FIG. 9 is a diagram showing Table 2.

DESCRIPTION OF THE INVENTION

In the following, embodiments will be described with reference to the accompanying drawings.

[Adhesive Substrate]

Figure 1:
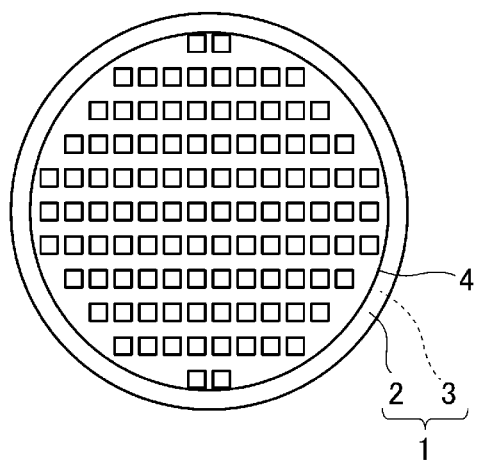
FIG. 1 is a plan view showing a mode in which an object is held immovably by a heat-resistant elastomer layer used as part of the adhesive substrate of the present invention.
Figure 2:
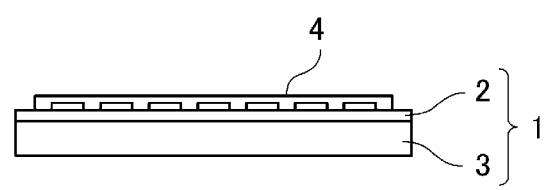
FIG. 2 is a front view showing a mode in which an object is held immovably by a heat-resistant elastomer layer used as part of the adhesive substrate of the present invention.

FIG. 1 is a plain view showing an aspect in which an object 4 is held immovably by a heat-resistant elastomer layer 2 used as part of the adhesive substrate 1 of the present invention. FIG. 2 is a front view showing a mode in which an object 4 is held immovably by a heat-resistant elastomer layer 2 used as part of the adhesive substrate 1 of the present invention. The adhesive substrate 1 of the present invention is used as part of a method for physically separating an object 4 from an adhesive substrate 1 wherein the adhesive substrate 1 of the present invention has a flexible base substrate 3 which has a thickness of between 0.2 mm or more and 2 mm or less and a heat-resistant elastomer layer 2 formed thereon, and whereby after the heat-resistant elastomer layer 2 has been adhered to an object 4, the edge of the adhesive substrate 1 is separated downward while the upper side of the object 4 held in an anchored state.

Moreover, when the edge of the adhesive substrate 1 is separated downward, separation may be started by pulling the end portion of the adhesive substrate 1 directly downward as described in a first separation method later, or indirect separation may be done using a holding plate 7 as described in a second separation method.

In order to be able to separate the object 4 by physically separating from the edge of the adhesive substrate 1 downward while the upper side of the object 4 held in an anchored state, the area of the base substrate 3 is substantially the same as the area of the heat-resistant elastomer layer 2, and the base substrate 3 and the heat-resistant elastomer layer 2 substantially overlap each other for the configuration of the adhesive substrate 1. In an alternative embodiment, the area of the base substrate 3 is larger than the area of the heat-resistant elastomer layer 2, and the edges of the base substrate 3 are located further outside from the heat-resistant elastomer layer 2. Furthermore, the area of the object 4 is smaller than the area of the heat-resistant elastomer layer 2, and the edges of the object 4 are preferably located within the area of the heat-resistant elastomer layer 2.

[Base Substrate]

The thickness of the base substrate 3 used for the adhesive substrate 1 of the present invention is 0.2 mm or more and 2 mm or less, and the base substrate 3 has flexibility. By setting the thickness of the base substrate 3 within the aforementioned range, it is possible to provide moderate flexibility while maintaining the physical strength of the adhesive substrate 1. The thickness of the base substrate 3 is preferably 0.2 mm or more and 2 mm or less, and more preferably 0.3 mm or more and 1 mm or less.

Further, since the base substrate 3 has flexibility, by applying a physical force to the lower end of the adhesive substrate 1 (for example, by pulling the end of the adhesive substrate 1 downward), both the base substrate 3 and the heat-resistant elastomer layer 2 begin to bend, and a gap is easily formed between the heat-resistant elastomer layer 2 and the object 4 from the point where the bending started; moreover, the end portion of the adhesive substrate 1 begins to physically separate at the lower end with this gap serving as a trigger and making it possible to physically separate the object 4 more easily and with less force. In this way, since it is possible to easily physically separate the object 4 without requiring heat or ultraviolet irradiation, it is possible to suppress a decrease in the adhesiveness of the heat-resistant elastomer layer 2; also, since the adhesive substrate 1 after separation returns to its original state, the adhesive substrate 1 can be repeatedly used.

For the base substrate 3, any material can be used so long as it has flexibility and sufficient physical strength and durability when the thickness is within the above range; however, the base substrate is preferably a flexible metal plate or resin plate. For the flexible metal plate, a metal plate made of SUS stainless steel, copper, a titanium alloy, iron nickel or the like can be used. Also, for the resin plate, it is preferable to use a resin sheet having flexibility and appropriate heat resistance with respect to the time of the resin sealing; resin plates made of various resins such as polyethylene terephthalate, polyethylene naphthalate, polycarbonate, polyether ether ketone, polyamide imide, glass epoxy resin, polyacetal and the like can be used. From these options, it is more preferable to use a metal plate made of SUS stainless steel having appropriate flexibility and excellent physical strength and durability.

Further, Young's modulus of the base substrate 3 is preferably between 2 GPa or more and 300 GPa or less. More preferably, Young's modulus of the base substrate 3 is between 20 GPa or more and 250 GPa or less. By adjusting the Young's modulus of the base substrate 3 in addition to the thickness of the base substrate 3 as described above, not only can the base substrate 3 be bent at the time the object 4 is separated, but also defects caused by the bending of the base substrate 3 (part misalignments, material leakage, etc.) can be avoided when placing the object 4 on resin sealing and transporting it in the mold and installing it.

Along the edge of the base substrate 3, it is preferable to provide a hole for hooking a hook and a recess for attaching a clamp so that a cable 6 can be used to pull downward.

[Heat-Resistant Elastomer Layer]

The adhesive substrate 1 of the present invention has a heat-resistant elastomer layer 2 layered on the base substrate 3. With regard to the elastomer used for the heat-resistant elastomer layer 2, it is common to use a silicone elastomer or a fluorine based elastomer.

Examples of the silicone elastomer can include KR 3700, KR 3701, X-40-3237-1, X-40-3240, X-40-3291-1, X-40-3229, X-40-3270, and X-40-3306 manufactured by Shin-Etsu Chemical Co., Ltd; TSR 1512, TSR 1516, and XR 37-B 9204 manufactured by Momentive Performance Materials Inc.; as well as SD 4584, SD 4585, SD 4560, SD 4570, SD 4600 PFC, and SD 4593 manufactured by Dow Corning Toray Co., Ltd.; and the like.

Examples of the fluorine based elastomer can include fluorosilicone rubber, tetrafluoroethylene-propylene rubber, vinylidene fluoride-hexafluoropropylene rubber, vinylidene fluoride-hexafluoropropylene-tetrafluoroethylene rubber, fluorinated polyether, and the like.

Among the options, an elastomer having a rubber hardness of between 1 or more and 30 or less is preferable, and an elastomer having a rubber hardness of between 1 or more and 10 or less is more preferable. By using an elastomer with low rubber hardness, it is possible to favorably hold the object 4 with the elastomer's own adhesiveness. Also, from the viewpoint of minimizing contamination of the object 4, it is preferable to use a fluorine based elastomer, and most preferably to use a fluorinated polyether.

The film thickness of the heat-resistant elastomer layer 2 is preferably between 1 μm or more and 50 μm or less, and more preferably between 5 μm or more and 20 μm or less.

By setting the film thickness of the heat-resistant elastomer layer 2 within the above range, it is possible to maintain good separability from the object 4, and the heat-resistant elastomer layer will have enough durability to hold the object 4.

[Object]

The adhesive substrate 1 of the present invention is used as part of a method for physically separating an object from an adhesive substrate 1 whereby after the heat-resistant-elastomer layer 2 has been adhered to the object 4, the edge of the adhesive substrate 1 is separated downward while the upper side of the object 4 held in an anchored state. For the present invention, the object 4 held by the adhesive substrate 1 is not particularly limited, but it is preferably a semiconductor chip sealed and integrated with a resin.

For the sealing resin used for sealing the semiconductor chip, conventionally known organic resins are able to be used, but more specifically, epoxy resin, phenol resin, polyimide resin, and the like are able to be used; however, epoxy resin is particularly preferable.

When separating the object 4 from the adhesive substrate 1 holding the object 4, while the object 4 is in an anchored state from the upper side, it is sufficient to apply a physical force to the end of the adhesive substrate to separate it (for example, by pulling the end of the adhesive substrate 1 downward).

In the case where the object 4 is a semiconductor chip which is sealed with resin and integrated, each integrated semiconductor chip is processed into semiconductor elements by cutting and grinding processes. [Method for Separating an Object from the Adhesive Substrate]

Another embodiment of the present invention relates to a method for physically separating an object 4 from an adhesive substrate 1 by starting to physically separate the end portion of the adhesive substrate 1 downward while the object 4 is adhered to the heat-resistant elastomer layer 2 which is used in the above adhesive substrate 1 while the object 4 was held in an anchored state from the upper side.

(First Separation Method)

Figure 3:
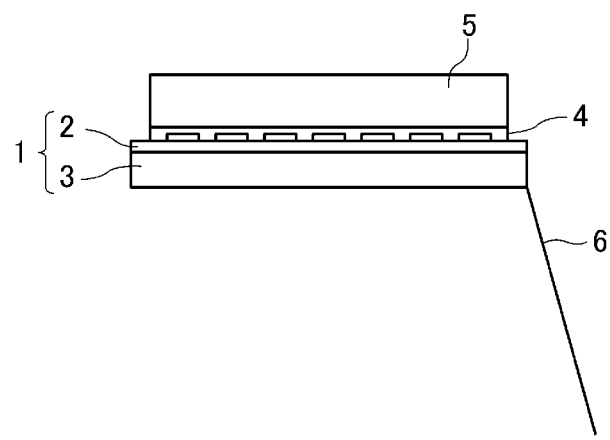
FIG. 3 is a front view showing a step of a method (first separation method) for separating an object without using a holding plate.
Figure 4:
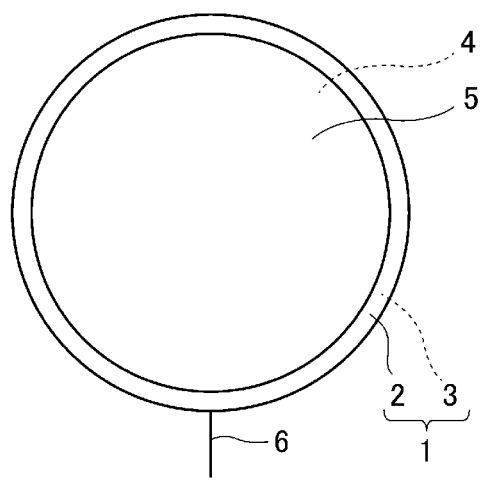
FIG. 4 is a drawing showing the embodiment of FIG. 3 in a plan view.

FIG. 3 is a front view showing one mode of a method (first separation method) for separating objects without using a holding plate 7, and FIG. 4 shows the embodiment of FIG. 3 in plain view.

For the first separation method, as shown in FIGS. 3 and 4, the object 4 is in a state in which it is adhered to the heat-resistant elastomer layer 2 and the object 4 is held in an anchored state by a fixing means 5 from the upper side. Using a cable 6 connected via a hole or a recess provided on the edge of the base substrate 3, by pulling the edge of base substrate 3 downwards, the heat-resistant elastomer layer 2 begins to bend along with the base substrate 3. From the point where the bending began, a gap easily forms between the heat-resistant elastomer layer 2 and the object 4, and by using this gap as a trigger, the end portion of the adhesive base substrate 1 begins to separate downward; thereby, physically separating the object 4 from the adhesive base substrate 1.

In the second separation method described later, the object 4 is separated by using a holding plate 7 and a separation jig 10 (see FIG. 7); however, in the first separation method, just like with the second separation method, except that a holding plate 7 is not used, the base substrate 3 is able to be pulled downward by means of the separation jig 10, which enables the objects to be separated.

[Second Separation Method]

Figure 5:
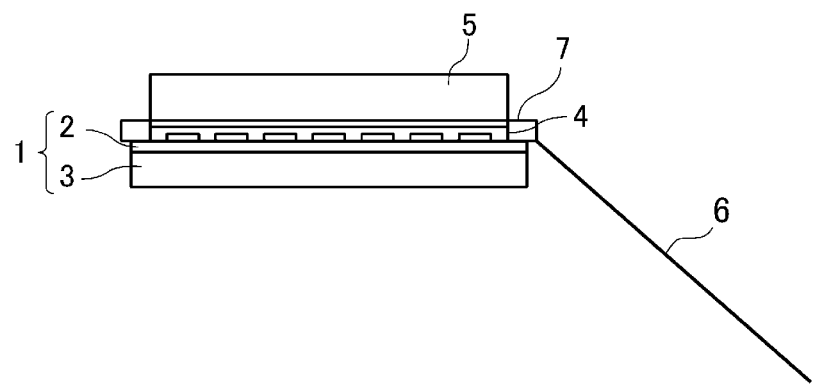
FIG. 5 is a front view showing a step of a method (second separation method) for separating an object using a holding plate.
Figure 6:
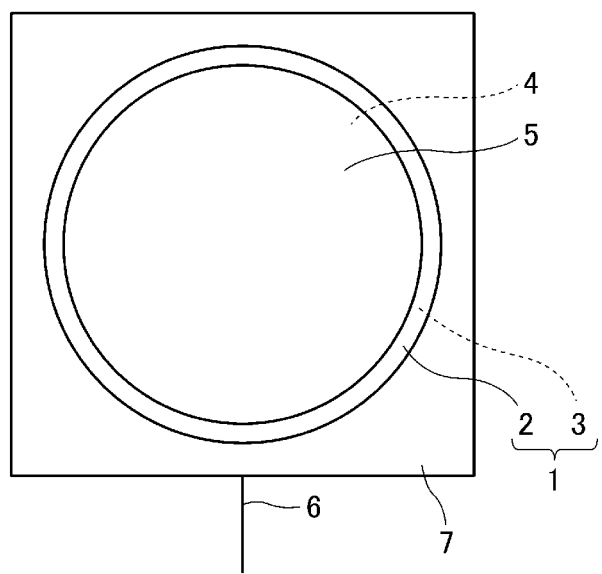
FIG. 6 is a plain view of the embodiment of FIG. 5 in a plain view.

FIG. 5 is a front view showing a mode of a method (second separation method) for separating objects using a holding plate 7. FIG. 6 shows the embodiment of FIG. 5 in plan view.

In the second separation method, as shown in FIGS. 5 and 6, the object 4 is in a state in which it is adhered to the heat-resistant elastomer layer 2 and is in a state in which the object 4 is anchored by the fixing means 5 from the upper side. In the areas where the object 4 and adhesive substrate 1 do not overlap in the perpendicular direction, the holding plate 7 is situated on the surface of the heat-resistant elastomer layer 2. For the second separation method of physically separating an object 4 from the adhesive substrate 1, by pulling the end of the holding plate 7 downward, both the base substrate 3 and the heat-resistant elastomer layer 2 begin to bend, and from the point where the bending began, a gap is easily formed between the heat-resistant elastomer layer 2 and the object 4; with this gap as a trigger, the end portion of the adhesive substrate 1 starts to physically separate downward.

Figure 7:
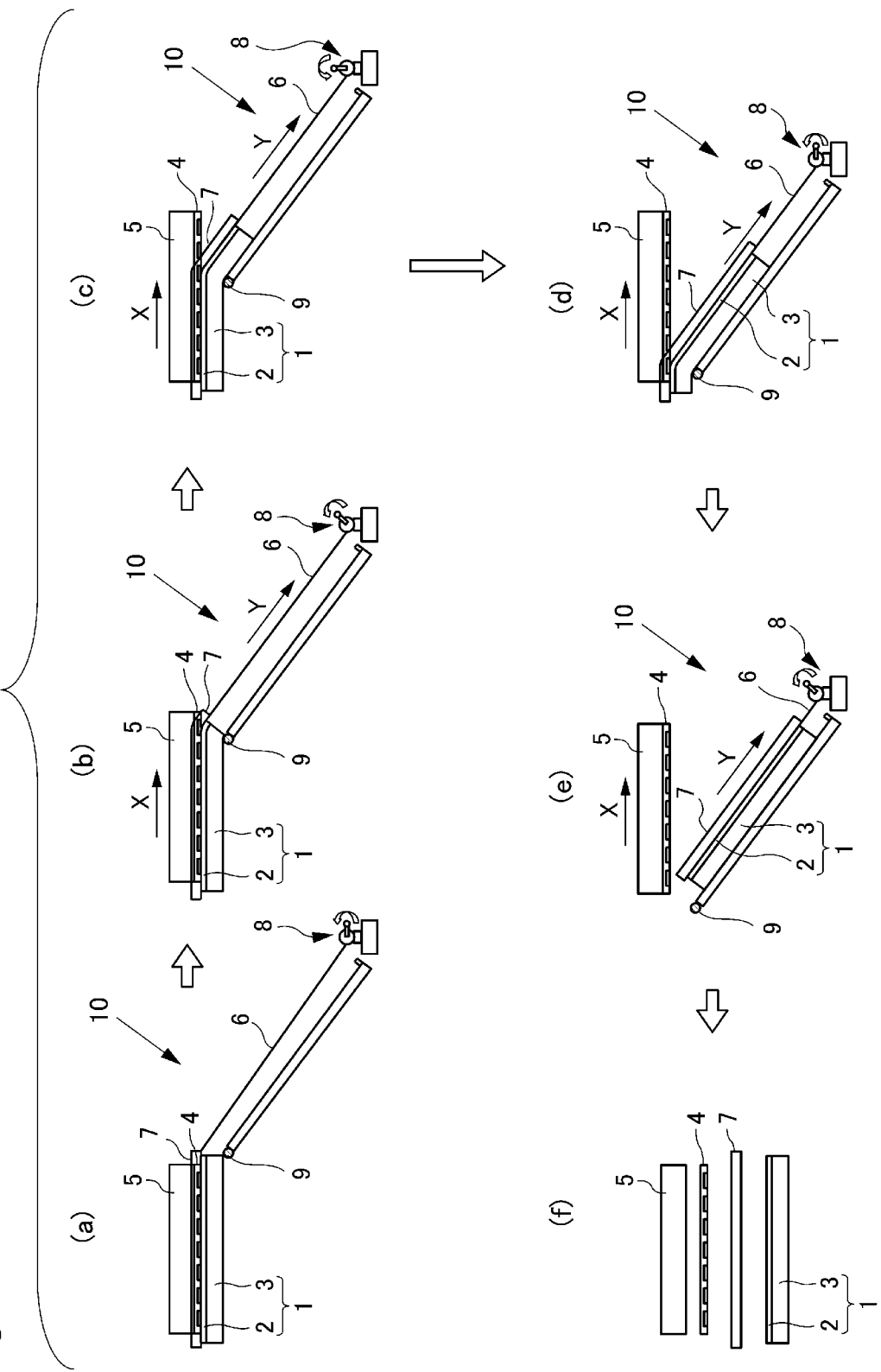
FIG. 7 is a view showing a series of stages of a second separation method using a separation jig.

In both the first separation method and the second separation method, separation of the object 4 may be performed manually, but as shown in FIG. 7, it is preferable to use a separation jig 10 because work efficiency/accuracy is improved. FIG. 7 describes more specifically a series of events for the second separation method using the separation jig 10. Furthermore, in FIG. 7, the fixing means 5 advances in a predetermined direction (the direction of the arrow X in FIG. 7). FIG. 7 shows a mode for pulling the end portion of the holding plate 7 downward in which a cable can be used. With regard to using a cable 6, a hole is made at the end of the holding plate 7, and the cable 6 is either directly attached to the hole, or after providing a hook on the end of the cable 6, by attaching the hook to the hole, and the cable 6 is then able to pull downward. Further, even if a hole is not provided in the holding plate 7, clips, clamps, or the like may be used on the end of the cable 6, and by grasping the end portion of the holding plate 7 with a clip, a clamp or the like, it is also possible to have the cable 6 pull downward.

Incidentally, like with the base substrate 3, the holding plate 7 also needs to have flexibility, and sufficient physical strength and durability must be provided. For the holding plate 7, the same material as the base substrate 3 can be used, and the thickness thereof is preferably between 0.2 mm or more and 0.5 mm or less.

FIG. 7(b) to FIG. 7(f) show stages in which an object is separated. The speed at which the fixing means 5 and the rotational speed of the rotary drive 8 advances are substantially the same, and that speed, when considering balancing the starting of the separation and the work efficiency, is preferably between 50 mm/min or more and 300 mm/min or less (hereinafter, this speed is referred to as the separation speed). The preferable angle formed between the direction in which the fixing means 5 advances (the direction of the X arrow in FIG. 7) and the direction the cable 6 pulls downward (the direction of the Y arrow in FIG. 7) is not less than 5 degrees and not more than 30 degrees (hereinafter, this angle is referred to as the separation angle). By setting the separation angle within the above range, the object 4 can be separated while suppressing the load on the adhesive substrate 1.

While the fixing means 5 is moving in a predetermined direction with the object 4 anchored from the upper side, the rotary drive 8 winds the cable 6 and rotates at substantially the same speed as the advancing speed of the fixing means 5. As the cable 6 is wound onto the rotary drive 8, the holding plate 7 is pulled downward, so that the end portion of the adhesive substrate 1 starts to physically separate downward. Specifically, at the same time as the holding plate 7 is pulled downward, the base substrate 3 moves downward together with the heat-resistant elastomer layer 2 while the base substrate 3 is bent with the roller 9 acting as the pivot axis. In this way, the separation of the object 4 progresses, and eventually the object 4 is separated from the adhesive substrate 1 as shown in FIG. 7(e), and as shown in FIG. 7(f), by unanchoring the object 4 from the fixing means 5, the object 4 can be obtained. Thus, by separating the adhesive substrate 1 and the holding plate in this manner, the adhesive substrate 1 is able to be reused.

Although the present invention has been described with reference to these embodiments, it goes without saying that the technical scope of the present invention is not limited to the scope of the invention described in the above embodiments, it is obvious to a person skilled in the art that various modifications or improvements can be added to the above embodiments. It is obvious from the description of the scope of the claims that modes with such modifications or improvements can also be included in the technical scope of the present invention.

EXAMPLES OF EXECUTION

Hereinafter, the present invention will be described in detail with reference to the examples, FIG. 8, and FIG. 9. It should be noted that the present invention is not in any way limited to the following examples. FIG. 8 is a diagram showing Table 1 in which various conditions, etc., according to Examples 1 to 4 are described. FIG. 9 is a diagram showing Table 2 in which various conditions, etc., according to Comparative Examples 1 to 2 are described.

Example 1

An adhesive substrate was prepared by forming a fluorine based elastomer layer having a thickness of 20 μm and a hardness of 5 on a base substrate made of SUS stainless steel with a diameter of 300 mm and a thickness of 0.5 mm. On the adhesive substrate, about 600 square wafer chips with a thickness of 0.5 mm and a side length of 5 mm were adhered and held immovably. The wafer chips on the adhesive substrate were introduced into a mold with a diameter of 280 mm and a thickness of 0.6 mm, and epoxy resin sealing was performed.

After removing the wafer chips on the adhesive substrate from the mold and cooling them, the wafer chips on the adhesive substrate were set up with a separating jig (see FIG. 7). For the holding plate, SUS stainless steel with a thickness of 0.3 mm was used. The SUS stainless steel was provided with a hole with a 290 mm diameter and was designed to press down on only the 0.5 mm base substrate without touching the epoxy substrate.

As a result of moving the arrangement when the separation speed was 100 mm/min and when the separation angle was 15 degrees, the epoxy resin molded item (object) was separated, and the adhesive substrate was also recovered. This adhesive substrate could then be used repeatedly.

Example 2

This example was conducted under the same conditions as in Example 1 except instead a silicone elastomer with a hardness of 30 was used, and the object was separated without any problem with the adhesive substrate was also being reusable.

Example 3

Epoxy resin sealing was performed under the same conditions as in Example 1 except that the base substrate was changed to a base substrate having a thickness of 0.25 mm and an opening on the end. After that, the holding plate was not used when separating, but instead a hook was hooked on the hole previously made in the base substrate and then separated. When the test was carried out with a separation angle of 30 degrees, separation occurred without problems, and the adhesive substrate was also reusable.

Example 4

The base substrate in Example 1 was changed to a base substrate having a thickness of 2.0 mm, a fluorine based elastomer was formed with a thickness of 5 μm, and epoxy resin sealing was performed under the same conditions as in Example 1. After that, when a test was carried out using a holding plate having a thickness of 0.3 mm at a separation angle of 5 degrees and a separation speed of 50 mm/min, separation occurred without any problem, and the adhesive substrate was also reusable.

Comparative Example 1

The base substrate in Example 1 was changed to a base substrate having a thickness of 0.1 mm and a fluorine based elastomer layer with a thickness of 20 μm was formed; then epoxy resin sealing was performed under the same conditions as in Example 1.

When the test was conducted under the same conditions as in Example 1 except that separation was carried out at a separation angle of 40°, separation was possible, but warpage occurred in the base substrate making reuse difficult.

Comparative Example 2

The base substrate in Example 1 was changed to a base substrate having a thickness of 3.0 mm and a silicone elastomer with a thickness of 100 μm was formed; then epoxy resin sealing was performed under the same conditions as in Example 1.

Thereafter, when separation was carried out, separation was carried out at a separation angle of 5 degrees and a separation speed of 50 mm/min by hooking a hole which had been previously made in the base substrate and not using a holding plate, the object could not maintain the suctioning from the suction means (fixing means) and instead dropped making separation impossible.

The invention claimed is:

1. A method for physically separating an object from an adhesive substrate, wherein the object is attached to a heat-resistant elastomer layer of the adhesive substrate, comprising the steps of:
    1) anchoring an upper side of the object by attaching a fixing means; and
    2) applying a downward force to a base substrate of the adhesive substrate, thereby causing the heat-resistant elastomer layer to bend, resulting in separation,
    wherein the adhesive substrate is repeatedly used, and
    the adhesive substrate returns to its original state after the object is separated from the adhesive substrate.

2. The method of claim 1, wherein the downward force is applied by a cable attached to the base substrate.

3. The method of claim 1, wherein the downward force is applied to a holding plate situated on the surface of the heat-resistant elastomer layer in an area where the object and the adhesive substrate do not overlap.

4. The method of claim 1, wherein the adhesive substrate comprises:
    the base substrate, wherein the base substrate is flexible; and
    the heat-resistant elastomer layer on the base substrate.

5. The method of claim 4, wherein a Young's modulus of the base substrate is 2 GPa or more and 300 GPa or less.

* * * * *